United States Patent
Yamada et al.

(10) Patent No.: US 6,784,765 B2
(45) Date of Patent: *Aug. 31, 2004

(54) MULTILAYER CERAMIC DEVICE

(75) Inventors: Toru Yamada, Osaka (JP); Kazuhide Uriu, Osaka (JP); Tsutomu Matsumura, Osaka (JP); Toshio Ishizaki, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 61 days.

This patent is subject to a terminal disclaimer.

(21) Appl. No.: 10/370,632

(22) Filed: Feb. 24, 2003

(65) Prior Publication Data

US 2003/0151471 A1 Aug. 14, 2003

Related U.S. Application Data

(62) Division of application No. 09/891,296, filed on Jun. 27, 2001, now Pat. No. 6,570,469.

(30) Foreign Application Priority Data

Jun. 27, 2000 (JP) ......................................... 2000-192265

(51) Int. Cl.[7] ............................ H03H 9/64; H03H 9/72; H01L 23/15; H01L 23/48; H01L 23/538
(52) U.S. Cl. ....................... 333/193; 333/133; 257/700; 257/703; 257/728; 257/729; 257/778; 257/788; 361/746
(58) Field of Search .................... 333/193–196, 333/133; 257/678, 690, 703, 723, 728, 729, 778, 788, 791–793, 700; 361/746

(56) References Cited

U.S. PATENT DOCUMENTS

| | | | |
|---|---|---|---|
| 4,737,742 A | 4/1988 | Takoshima et al. | ......... 333/150 |
| 5,406,235 A | 4/1995 | Hayashi | ........................ 333/204 |
| 5,459,368 A | 10/1995 | Onishi et al. | ............ 310/313 R |
| 5,796,165 A * | 8/1998 | Yoshikawa et al. | .......... 257/728 |
| 5,861,670 A * | 1/1999 | Akasaki | ....................... 257/737 |
| 5,929,510 A | 7/1999 | Geller et al. | ................. 257/635 |
| 5,949,654 A * | 9/1999 | Fukuoka | ...................... 361/760 |
| 6,038,133 A | 3/2000 | Nakatani et al. | ............. 361/760 |
| 6,060,960 A | 5/2000 | Tanaka et al. | ............... 333/104 |
| 6,181,015 B1 | 1/2001 | Gotoh et al. | ................. 257/778 |
| 6,285,559 B1 | 9/2001 | Fukiharu | ...................... 361/760 |
| 6,426,551 B1 * | 7/2002 | Kawakami et al. | .......... 257/700 |
| 6,456,172 B1 | 9/2002 | Ishizaki et al. | .............. 333/133 |
| 6,570,469 B2 * | 5/2003 | Yamada et al. | .............. 333/193 |

FOREIGN PATENT DOCUMENTS

| | | | | |
|---|---|---|---|---|
| EP | 0 794 616 | * | 9/1997 | |
| EP | 1 014 592 | | 6/2000 | |
| EP | 1 094-538 | * | 4/2001 | |
| JP | 1-273390 | | 11/1989 | ................... 29/793 |
| JP | 2-186662 | | 7/1990 | .................. 257/790 |
| JP | 4-79601 | | 3/1992 | |
| JP | 4-217335 | * | 8/1992 | |
| JP | 5-235689 | | 9/1993 | .................. 333/193 |
| JP | 6-209168 | | 7/1994 | |

(List continued on next page.)

Primary Examiner—Barbara Summons
(74) Attorney, Agent, or Firm—Wenderoth, Lind & Ponack, L.L.P.

(57) ABSTRACT

A mulitlayer ceramic device improves device functionality, reduces overall device size and profile, makes manufacturing easier, and improves reliability. A first ceramic layer 1 has a first multilayer circuit pattern 2 electrically connected through via holes 3. A second ceramic layer 2 also has a second multilayer circuit pattern 2 electrically connected through via holes 3. A thermosetting resin sheet 17 is disposed between the first and second ceramic layers. The thermosetting resin sheet has through holes filled with a conductive paste for electrically connecting one of multiple circuit pattern layers in the first ceramic layer with one of multiple circuit pattern layers in the second ceramic layer.

7 Claims, 8 Drawing Sheets

FOREIGN PATENT DOCUMENTS

| | | |
|---|---|---|
| JP | 6-283619 | 10/1994 |
| JP | 8-195645 | 7/1996 |
| JP | 9-162692 | 6/1997 |
| JP | 11-220262 | 8/1999 |
| JP | 11-340416 | 12/1999 |
| JP | 2001-168269 | 6/2001 |

* cited by examiner

MULTILAYER CERAMIC DEVICE

This application is a division of Ser. No. 09/891,296 filed Jun. 27, 2001 now U.S. Pat. No. 6,570,469.

BACKGROUND OF THE INVENTION

1. Field of the Invention

The present invention relates generally to a multilayer ceramic device used in high frequency wireless devices such as mobile telephones, and relates more particularly to a multilayer ceramic RF device.

2. Description of Related Art

Multilayer ceramic devices, and particularly multilayer ceramic radio frequency (hereinafter referred to as RF) devices operating in the RF band, have contributed greatly to size reductions in mobile telephones and other high frequency wireless devices. A typical conventional multilayer ceramic RF device is described below with reference to FIG. 12 and FIGS. 13A–E.

FIG. 12 is a section view of a conventional multilayer ceramic RF device having a low temperature sintered ceramic layer 101 and multilayer circuit conductors forming an RF circuit 102. Also shown in FIG. 12 are via holes 103 and chip components 105 such as resistors, capacitors, inductors, and other packaged semiconductor chip components. A metal cap 107 shields the various chip components 105.

The operation of this conventional multilayer ceramic RF device is described next below.

The multilayer circuit conductor 102 electrically interconnects the chip components 105, and forms intralayer capacitors and intralayer inductors inside the low temperature sintered ceramic layer 101. Collectively, these various components form an RF circuit so that the device functions as a multilayer RF switch or other multilayer ceramic RF device.

FIGS. 13A–C are a block diagram showing the configuration of a conventional multilayer ceramic RF device. These individual discrete devices function as a multilayer filter (FIG. 13A), a surface acoustic wave (hereinafter referred to as SAW) filter (FIG. 13B), and an RF switch (FIG. 13C).

It will be noted that the construction described above does not have a sealing resin protecting the surface mounted chip components, or a metal sealant cap (metal cap 107) sealing a cavity. The resulting problem is that bare semiconductor devices, SAW filters, and other components that must be sealed cannot be incorporated in the RF device. The conventional metal cap 107 shown in FIG. 12 simply provides an electromagnetic shield and does nothing to seal the device, and the above-noted components therefore cannot be provided.

Furthermore, the above-described device has a single ceramic layer. As taught in Japanese Patent Laid-open Publication (kokai) H4-79601 (U.S. Pat. No. 5,406,235), it is possible to monolithically mold ceramic layers or other dielectric bodies having different dielectric constants as a way to incorporate a built-in high capacitance capacitor and achieve a multiple function device. Such a device can be produced by, for example, monolithically sintered ceramic layers of different compositions. The problem here is that ceramics of different compositions have different contraction and expansion coefficients, and molding by monolithic sintering is therefore very difficult. A parasitic capacitance affecting device characteristics can also form between ceramic layers of different dielectric constants in monolithically molded ceramic devices made from ceramics of different dielectric constants.

SUMMARY OF THE INVENTION

With consideration for the problems described above, it is an object of the present invention to provide a multilayer ceramic device capable of incorporating components such as bare semiconductor devices and SAW filters.

A further object of this invention is to improve device functionality, reduce device size and profile, improve manufacturability, and improve device reliability.

A yet further object of this invention is to improve overall performance of a multilayer ceramic device providing plural functions with optimized circuit design.

To achieve the above objects, a multilayer ceramic device according to the present invention has a first ceramic layer having a first multilayer circuit pattern electrically connected through interlayer via holes; a second ceramic layer having a second multilayer circuit pattern electrically connected through interlayer via holes; and a thermosetting resin sheet disposed between the first and second ceramic layers. The thermosetting resin sheet has a through hole filled with a conductive resin electrically interconnecting the first multilayer circuit pattern in the first ceramic layer with the second multilayer circuit pattern in the second ceramic layer.

The ceramic layers have at least one internal circuit pattern layer, and the circuit patterns are electrically connected through the via holes. The ceramic layers are preferably made from a high dielectric constant material with a dielectric constant of 10 or higher, and a low dielectric constant material with a dielectric constant less than 10. It is noted that the dielectric constant may be similar to relative dielectric constant.

Exemplary high dielectric constant materials include Bi—Ca—Nb—O (dielectric constant=58), Ba—Ti—O and Zr(Mg, Zn, Nb)—Ti—Mn—O.

Exemplary low dielectric constant materials include alumina borosilicate glass (dielectric constant=7), and forsterite ceramics.

Exemplary thermosetting resins include epoxy resin, phenol resin, and cyanate resins.

The ceramic layers of a multilayer ceramic device according to the present invention are preferably made of a multilayer monolithic, low temperature co-fired ceramics (LTCC).

Further preferably, the first and second ceramic layers are in unity with the thermosetting resin sheet. More preferably, the first and second ceramic layers are thermoset together with the thermosetting resin to be in unity.

Yet further preferably, the first and second ceramic layers each have a different dielectric constant.

As noted above, the ceramic layers have different dielectric constants, and the dielectric constant of the thermosetting resin sheet disposed between the ceramic layers is lower than the dielectric constant of either ceramic layer. The construction of the multilayer ceramic device reduces the parasitic capacitance that occurs between ceramic layers of different dielectrics, and improves device characteristics.

Forming a pattern at the interface between the ceramic layer and thermosetting resin sheet also makes it possible to avoid loss and adjust for mismatched impedance occurring between the multilayer circuit pattern and other circuits formed inside the ceramic layers.

It should be noted that there is little interference between patterns formed at the interface to the ceramic layer, and good device characteristics can be achieved, because the dielectric constant of the thermosetting resin is extremely low.

Yet further preferably, a multilayer ceramic device according to this invention has a third ceramic layer having a third multilayer circuit pattern electrically connected through interlayer via holes; and a thermosetting resin sheet disposed between the second and third ceramic layers. The dielectric constant of the first ceramic layer is less than 10; the dielectric constant of the second ceramic layer is 10 or higher; and the dielectric constant of the third ceramic layer is less than 10.

Yet further preferably, the third ceramic layer is substantially as thick as the first ceramic layer, and the second ceramic layer is thicker than the first and third ceramic layers.

Yet further preferably, the thickness of the first ceramic layer is different from that of the second ceramic layer.

Yet further preferably, a land grid array terminal is disposed to the second ceramic layer on a side thereof not facing the other ceramic layer.

This land grid array is used for electrical connection to the circuit board when the multilayer ceramic device is mounted on a circuit board.

Yet further preferably, a thermosetting resin sheet is disposed between the second ceramic layer and the land grid array terminal.

Disposing a thermosetting resin layer between the bottom of the bottom ceramic layer of the device and the land grid array terminals disposed to the same bottom improves the drop strength of the bottom of the ceramic device. In addition, using a thermosetting resin with a dielectric constant lower than the dielectric constant of the ceramic layer reduces parasitic components with the circuit board, enables impedance matching to be changed, and provides greater freedom in circuit design.

Yet further preferably, the first ceramic layer has a semiconductor bare chip and a SAW filter of which the electrode part is sealed airtight and mounted face down on a surface of the first ceramic layer not facing the second ceramic layer. The electrode part of the bare chip and SAW filter faces the first ceramic layer surface, and the tops thereof are coated with a sealing resin.

Exemplary semiconductor bare chips include bipolar transistors, FET, diodes, and ICs, and are made from silicon and other compound semiconductor materials. The SAW filter is a single crystal piezoelectric element of quartz, lithium tantalate ($LiTaO_3$) or lithium niobate ($LiNbO_3$), for example. These components can be mounted face down, that is, with the electrodes electrically connected facing the surface of the ceramic layer on which the component is mounted, by using stud bump bonding (SBB), gold to gold interconnection (GGI), or other bump connection technique.

Yet further preferably, the first ceramic layer has a recess at the top thereof, and a semiconductor bare chip and a SAW filter are mounted on the cavity bottom with an electrode part thereof facing the cavity bottom, and the top thereof coated with a sealing resin.

Yet further preferably, the first ceramic layer has a hole part. A semiconductor bare chip and a SAW filter are mounted on a surface of the thermosetting resin sheet forming the bottom of the hole part, and a top of the bare chip and SAW filter are coated with a sealing resin.

In addition, the dielectric constant of the first ceramic layer is less than 10, and the dielectric constant of the second ceramic layer is 10 or more.

Yet further preferably, the semiconductor bare chips include a semiconductor bare chip that operates at a frequency in the ultra high frequency (UHF) band or higher.

Yet further preferably, the semiconductor bare chips include a PIN diode. Further preferably, the SAW filter has an unbalanced input, balanced output terminal structure.

A multilayer ceramic device according to a further aspect of the invention has a first ceramic layer having a first multilayer circuit pattern electrically connected through interlayer via holes; and a second ceramic layer having a second multilayer circuit pattern electrically connected through interlayer via holes. The second ceramic layer is layered on the first ceramic layer. The first ceramic layer has mounted on a surface thereof not facing the second ceramic layer a semiconductor bare chip and a SAW filter, the electrode part of which is sealed. The electrode part of the bare chip and SAW filter faces the first ceramic layer surface, and the tops thereof are coated with a sealing resin. The second ceramic layer has a land grid array terminal disposed to a surface of the second ceramic layer not facing the first ceramic layer.

Further preferably, the first and second ceramic layers of this multilayer ceramic device each have a different dielectric constant.

Yet further preferably, the first ceramic layer has a recess at the top thereof, and a semiconductor bare chip and a SAW filter are mounted on the cavity bottom with an electrode part thereof facing the cavity bottom, and the top thereof coated with a sealing resin.

Yet further preferably, the multilayer ceramic device also has a third ceramic layer having a third multilayer circuit pattern electrically connected through interlayer via holes. The third ceramic layer is laminated to a surface of the second ceramic layer not facing the first ceramic layer. In this multilayer ceramic device, the dielectric constant of the first ceramic layer is less than 10, the dielectric constant of the second ceramic layer is 10 or higher, and the dielectric constant of the third ceramic layer is less than 10.

A multilayer ceramic device according to a further aspect of the invention has, laminated in order, a first ceramic layer having a recess at a top part thereof and a first multilayer circuit pattern electrically connected through interlayer via holes; and a second ceramic layer having a second multilayer circuit pattern electrically connected through interlayer via holes. The first ceramic layer has a semiconductor bare chip and a SAW filter mounted on the cavity bottom with an electrode part thereof facing the cavity bottom, and the top thereof coated with a sealing resin.

Further preferably, an electrode pattern is formed on a flat surface part of the first ceramic layer on the side of the first ceramic layer not facing the second ceramic layer, and this electrode pattern forms an array antenna.

The mobile terminal device includes a display and a communication member. The communication member has a multilayer ceramic device. Further, the multilayer ceramic device has a first ceramic layer, a second ceramic layer, and a thermosetting resin sheet. The first ceramic layer has a first multilayer circuit pattern electrically connected through interlayer via holes. The second ceramic layer has a second multilayer circuit pattern electrically connected through interlayer via holes. The thermosetting resin sheet is disposed between the first and second ceramic layers. Also, the thermosetting resin sheet has a through hole filled with a conductive resin electrically interconnecting the first multilayer circuit pattern in the first ceramic layer with the second multilayer circuit pattern in the second ceramic layer.

Exemplary mobile terminal devices include mobile telephone, and the like. As mentioned above, the multilayer ceramic may be reduced device size and be improved device functionality, therefore the mobile terminal device may be reduced device size and be improved device functionality.

BRIEF DESCRIPTION OF THE DRAWINGS

Other objects and attainments together with a fuller understanding of the invention will become apparent and appreciated by referring to the following description and claims taken in conjunction with the accompanying drawings.

DESCRIPTION OF THE PREFERRED EMBODIMENTS

Figure 1:
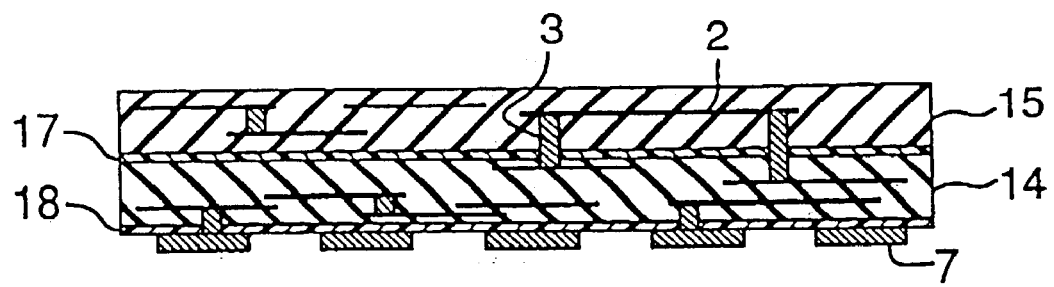
FIG. 1 is a section view of a multilayer ceramic RF device according to a first preferred embodiment of the present invention.

The preferred embodiments of the present invention are described below with reference to the accompanying figures. It should be noted that like reference numerals designate like or corresponding parts throughout the views.

A multilayer ceramic device according to a first preferred embodiment of our invention has, as shown in the section view in FIG. 1, a high dielectric constant, ceramic layer 15 with a dielectric constant of 58 at the top, a low dielectric constant ceramic layer 14 with a dielectric constant of 7 at the bottom, and a thermosetting adhesive resin 17 with a dielectric constant of approximately 4 between the top and bottom ceramic layers. Both of the ceramic layers 14 and 15 contain copper or silver multilayer circuit conductors 2 to which electrical connections are made by way of via holes. A plurality of through holes is also provided in the adhesive resin 17 sandwiched between the two ceramic layers 14 and 15; the through holes are filled with a conductive resin for electrically connecting the multilayer circuit patterns of the top and bottom ceramic layers. This reduces the parasitic capacitance between the two ceramic layers when compared with direct contact between two ceramic layers having different dielectric constants. A land grid array (LGA) 7 is disposed on the bottom of the bottom low dielectric constant ceramic layer 14. Another thermosetting adhesive resin 18 is sandwiched between the bottom of the ceramic layer 14 and the LGA 7, thereby increasing device strength.

The ceramic layer are preferably made from a high dielectric constant material with a dielectric constant of 10 or higher, and a low dielectric constant material with a dielectric constant less than 10.

High dielectric constant ceramics with a dielectric constant of 10 or higher include Bi—Ca—Nb—O (dielectric constant=58). The invention shall not be so limited, however, and other ceramics such as Ba—Ti—O and Zr(Mg, Zn, Nb)—Ti—Mn—O can also be used.

Low dielectric constant ceramics with a dielectric constant less than 10 include alumina borosilicate glass (dielectric constant=7), but the invention shall not be so limited as ceramics such as forsterite ceramics can also be used.

The intralayer capacitors and inductors are formed inside the low dielectric constant, low temperature sintered ceramic 14 and the high dielectric constant, low temperature sintered ceramic 15 by using the multilayer circuit conductors 2. The multilayer circuit patterns formed inside the multilayer monolithically fired, low temperature sintered ceramic are made of copper or silver, and are electrically connected through interlayer via holes 3 at desirable places in the multilayer circuit pattern.

The pattern in each layer of the multilayer circuit pattern is formed by using a screen printing technique, for example. The via holes are formed in a dielectric sheet by using a puncher, for example, and the holes are then filed with a conductive paste by using a printing technique.

A method for forming this ceramic 1 having internal multilayer circuit conductors 2 is described in detail below, wherein a low dielectric constant ceramic is used an example.

First, a slurry of a low melting point glass frit, organic binder, and organic solvent mixed with an alumina borosilicate or other ceramic powder is prepared and formed to produce a green (that is, unfired or "raw") glass ceramic sheet. A plurality of via holes for electrically connecting the wires of the top and bottom ceramics is then formed in this green sheet by a mechanical punching or laser punching. A desirable circuit pattern of strip lines and capacitor electrodes, for example, is then printed on this green sheet by using a conductive paste of primarily silver, copper, or other metal powder. The via holes in the green sheet are also filled with a conductive paste. Plural green sheets are then stacked precisely aligned so as to ensure reliable electrical connections therebetween, then heated and compressed under specific conditions to bond them together to form a multilayer green laminate. This multilayer green laminate is then dried and sintered at approximately 400 to 500 degrees centigrade in an oxidizing oven to burn the organic binder out of the green sheets.

When a powder using silver or gold as the primary conductor is used, the ceramic laminate can be obtained by baking in air or other oxidizing atmosphere at a temperature of approximately 850 to 950 degrees centigrade. When copper powder is used as the primary conductor, the ceramic laminate can be obtained by baking at approximately 850 to 950 degrees centigrade in an inert gas or reducing atmosphere.

It will be obvious that while the multilayer ceramic device described above has the high dielectric constant ceramic layer 15 at top and the low dielectric constant ceramic layer 14 at the bottom, the invention shall not be so limited to the example. This arrangement can be obviously reversed, for example, so that the low dielectric constant ceramic layer is at the top and the high dielectric constant ceramic layer is at the bottom. In this case, an approximately 50 ohm circuit can be formed in the top low dielectric constant ceramic, for example.

Exemplary thermosetting resins that can be used for adhesive resins 17 and 18 include epoxy resin, phenol resin, and cyanate resins. It will also be noted that the thermosetting resins containing inorganic fillers described in U.S. Pat. No. 6,038,133 (corresponding to Japanese Patent Laid-open Publication (kokai) H11-220262) can also be used for the thermosetting resins in this invention. The United States Patent is thus incorporated herein by reference.

The benefit of disposing a thermosetting adhesive resin 17 with a dielectric constant of approximately 4 between two ceramic layers 14 and 15 is described below.

First, mismatched impedance results when a high dielectric constant ceramic layer 15 and a low dielectric constant ceramic layer 14 contact directly due to impedance differences between the circuits of the multilayer circuit conductors disposed inside the ceramic layers, and losses often result. By disposing a thermosetting adhesive resin 17 between the two ceramic layers as described above, however, a pattern can also be formed in the interface between the two ceramic layers 14 and 15 and the adhesive resin 17 to adjust for the impedance mismatch. There is little interference between the patterns and good device characteristics can be achieved between the adhesive resin 17 has an extremely low dielectric constant.

The benefit of disposing an adhesive resin 18 having an even lower dielectric constant between the bottom ceramic layer 14 and the LGA 7 is described next below.

The adhesive resin 18 absorbs impact shock such as results from the multilayer ceramic device being dropped, and thus improves the drop strength of the device. Furthermore, sandwiching an adhesive resin 18 having a dielectric constant lower than dielectric constant of the ceramic layer 14 also reduces parasitic components occurring with the circuit substrate, changes the impedance matching, and enables a greater degree of freedom in circuit design.

The benefit of using ceramics with different dielectric constants for the top ceramic layer 15 and bottom ceramic layer 14 is described next. The features of the top high dielectric constant ceramic layer 15 are described first, the features of the bottom low dielectric constant ceramic layer 14 are described next, and then the conditions for and effect of combining ceramics of different dielectric constants are described.

In general, wavelength can be shortened with strip lines that can be formed in high dielectric constant ceramics so that, for example, the length of a strip line resonator can be shortened inversely proportional to the square root of the dielectric constant. It follows that a high-dielectric constant ceramic is a suitable material for making small, high Q strip line resonators. However, the characteristic impedance of a strip line is usually low. The characteristic impedance of a strip line formed by a screen printing process with a minimum line width of 100 mm and 2 mm shield gap, for example, is about 20 ohms to 30 ohms. It is therefore in practice not possible to form a 50 ohm line. On the other hand, the high dielectric constant means it is simple to create high capacitance intralayer capacitors in a limited area.

On the other hand, while the wavelength of strip lines formed in a low dielectric constant ceramic cannot be shortened as much, it is relatively easy to achieve a high characteristic impedance of 50 ohms or more, and intralayer inductors can thus be easily produced. Furthermore, because the dielectric constant is low, the field coupling capacity of adjacent strip lines is relatively low and thus suited to forming circuit layers.

It is therefore possible to simultaneously reduce size and improve performance by bonding ceramic layers of different dielectric constants where each ceramic layer contains suitably optimized circuit elements. Furthermore, due to the relationship between the characteristic impedance of the strip lines, the dielectric constant of the top high dielectric constant ceramic layer is preferably 10 or greater, and further preferably from approximately 40 to approximately 60, and the dielectric constant of the bottom low dielectric constant ceramic layer is preferably less than 10.

Figure 2:
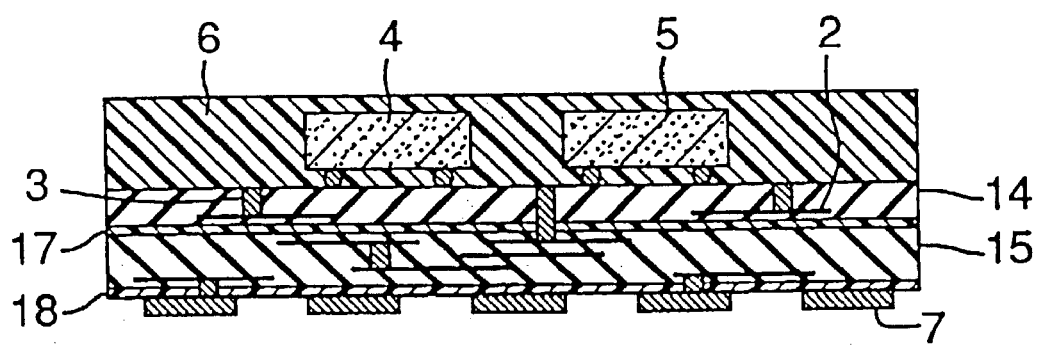
FIG. 2 is a section view of a multilayer ceramic RF device according to a second preferred embodiment of the present invention.

FIG. 2 is a section view of a multilayer ceramic RF device according to a second preferred embodiment of the present invention.

As shown in FIG. 2, this multilayer ceramic RF device has a low dielectric constant ceramic layer 14, a high dielectric constant ceramic layer 15, adhesive resins 17 and 18, multilayer circuit conductors 2, interlayer via holes 3, a bare semiconductor chip 4, a SAW filter 5, sealing resin 6, and LGA 7. This multilayer ceramic RF device differs from that of the first embodiment in that, as shown in FIG. 2, the bare semiconductor chip 4 and SAW filter 5 are mounted on top of the top low dielectric constant ceramic layer 14 with the electrodes thereof face down against the top of the ceramic layer 14, and the bare semiconductor chip 4 and SAW filter 5 are then sealed by the sealing resin 6.

The structure of this multilayer ceramic RF device is described next with reference to FIG. 2.

First, the intralayer capacitors and inductors are formed inside the low dielectric constant, low temperature sintered ceramic 14 and the high dielectric constant, low temperature sintered ceramic 15 by using the multilayer circuit conductors 2. The multilayer circuit patterns formed inside the multilayer monolithically fired, low dielectric constant, low temperature sintered ceramic layer and high dielectric constant, low temperature sintered ceramic layer are made from copper or silver, and are electrically connected through interlayer via holes at desirable places in the multilayer circuit patterns.

The pattern in each layer of the multilayer circuit pattern is formed by using a screen printing technique, for example. The interlayer via holes are formed in a dielectric sheet by using a puncher, for example, and the holes are then filed with a conductive paste by using a printing technique.

The adhesive resins 17 and 18 are sheets of an uncured thermosetting resin compound containing inorganic filler.

Holes are then formed as desired in the sheets and then filled with a conductive resin material. These adhesive resin sheets are then placed between the low temperature co-fired ceramic (LTCC) layers 14 and 15 and set to form a monolithic device.

A LGA 7 is formed on the bottom of the ceramic device for making external connections. The top of the ceramic device is coated with a sealing resin 6 so as to encapsulate the bare semiconductor chip 4 and SAW filter 5 mounted face down on the top of the ceramic device. These components combined form an RF circuit so that, for example, the ceramic device functions as a multilayer RF switch or other type of ceramic multilayer RF device.

This embodiment of the invention differs greatly from the prior art in that a bare SAW filter chip and bare semiconductor chip operating at a frequency above the ultra high frequency (UHF) band are mounted face down on top of a flat ceramic device, and are then coated with a sealing resin formed on top of the ceramic device so as to coat the bare chips. Bare semiconductor chips include bipolar transistors, FET, diodes, and ICs, and are made from silicon and other compound semiconductor materials. A SAW filter is a single crystal piezoelectric element of quartz, lithium tantalate ($LiTaO_3$) or lithium niobate ($LiNbO_3$), for example. These components can be mounted face down, that is, with the electrodes electrically connected facing the surface of the ceramic layer on which the component is mounted, by using stud bump bonding (SBB), gold to gold interconnection (GGI), or other bump connection technique.

Furthermore, by separately firing the multilayer low dielectric constant, low temperature co-fired ceramic layer 14 and the multilayer high dielectric constant, low temperature co-fired ceramic layer 15, and then bonding the separately fired ceramic layers 14 and 15 together by using adhesive resins 17 and 18, the adhesive resin layer absorbs warping of the ceramic layers resulting from differences in thermal expansion coefficients during firing. This improves the degree of freedom in design and achieves a powerful bond. In addition, placing an adhesive resin on the lowest layer improves electrode strength and can thus reduce defects resulting from drop tests, for example.

It is therefore possible, as described in the first embodiment, to simultaneously reduce size and improve performance by bonding ceramic layers of different dielectric constants where each ceramic layer contains suitably optimized circuit elements. Furthermore, due to the relationship between the characteristic impedance of the strip lines, the dielectric constant of the top ceramic layer is preferably less than 10, and the dielectric constant of the bottom ceramic layer is preferably 10 or greater, and further preferably from approximately 40 to approximately 60.

As described above, a ceramic device according to this second embodiment of the invention is achieved by using an adhesive resin to bond ceramic layers of different dielectric constants. More specifically, the top layer is a low dielectric constant, low temperature co-fired ceramic layer with a dielectric constant of less than 10, the bottom layer is a high dielectric constant, low temperature co-fired ceramic layer with a dielectric constant of 10 or greater, an adhesive resin is disposed between the bonding surfaces of the top and bottom low temperature co-fired ceramic layers and on the bottom of the bottom ceramic layer. As a result, this embodiment provides, in addition to the benefits achieved with the first embodiment, a multilayer ceramic RF device having even less warping in the ceramic device and greater electrode strength.

Figure 3:
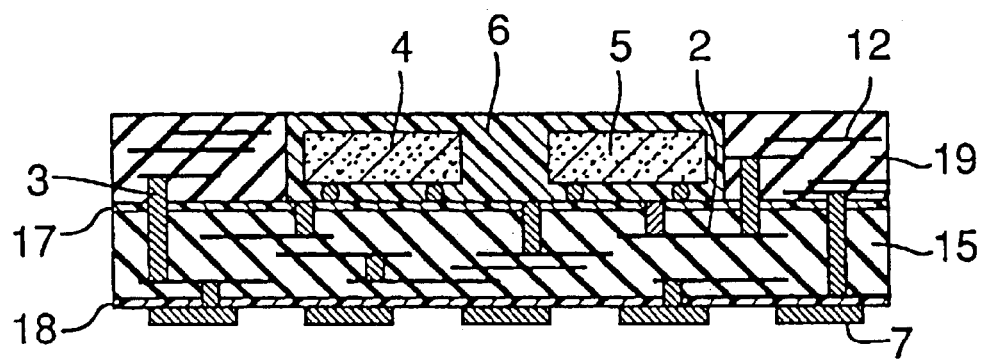
FIG. 3 is a section view of a multilayer ceramic RF device according to a third preferred embodiment of the present invention.

FIG. 3 is a section view of a multilayer ceramic RF device according to a third preferred embodiment of the present invention.

Shown in FIG. 3 are a low dielectric constant, low temperature co-fired ceramic layer with a cavity 19 as the top layer, a high dielectric constant, low temperature co-fired ceramic layer 15 as the bottom layer, adhesive resins 17 and 18, multilayer circuit conductors 2, interlayer via holes 3, bare semiconductor chip 4, SAW filter 5, sealing resin 6, and LGA 7.

What differs between this ceramic device and the ceramic device shown in FIG. 2 is that the ceramic layer with cavity 19 is disposed as the top layer in place of low temperature co-fired ceramic layer 14, high dielectric constant, low temperature co-fired ceramic layer 15 is disposed as the bottom layer, adhesive resin 17 is disposed at the bonding interface between the low temperature co-fired ceramic layers, and adhesive resin 18 is formed as the bottom-most layer on the bottom of ceramic layer 15.

The operation of a multilayer ceramic RF device thus comprised is described below.

The intralayer capacitors and inductors are formed inside the ceramic layer with cavity 19 and high dielectric constant, low temperature co-fired ceramic layer 15 by using the multilayer circuit conductors 2. The multilayer circuit patterns formed in the monolithic multilayer, low temperature co-fired ceramic layers are made of copper or silver, and the circuit patterns are electrically connected by interlayer via holes formed at the desirable electrical connections.

The adhesive resins 17 and 18 are sheets of an uncured thermosetting resin compound containing inorganic filler. Holes are then formed as desired in the sheets and then filled with a conductive resin material. These adhesive resin sheets are then placed between the low temperature co-fired ceramic layers 19 and 15 and set to form a monolithic device.

A LGA 7 is formed on the bottom of the ceramic device for making external connections. The bare semiconductor chip 4 and SAW filter 5 are mounted face down inside the cavity, which is then filled with sealing resin 6 so as to cover the contained components. These components combined form an RF circuit so that, for example, the ceramic device functions as a multilayer RF switch or other type of ceramic multilayer RF device.

This embodiment of the invention differs greatly from the second embodiment in that it has a different laminated construction. More specifically, the top layer of this ceramic device is the low dielectric constant, low temperature co-fired ceramic layer with cavity 19, the bottom layer is a high dielectric constant, low temperature co-fired ceramic layer 15, the adhesive resin 17, is disposed at the bonding interface between these low temperature co-fired ceramic layers, and the adhesive resin 18 is formed as the bottom-most layer.

By separately firing the low dielectric constant, low temperature co-fired ceramic layer with cavity 19 and the high dielectric constant, low temperature co-fired ceramic layer 15, and then bonding the separately fired ceramic layers 19 and 15 together by using the adhesive resin 17, the adhesive resin layer absorbs warping of the ceramic layers resulting from differences in thermal expansion coefficients during firing. This provides a greater degree of design freedom.

Providing a cavity in a multilayer monolithic ceramic device greatly increases the potential for warping due to asymmetry in the top and bottom layers. On the other hand, the structure of the present embodiment is an extremely effective way to improve the flatness of the ceramic device surface, which is essential to mounting bare chips including SAW filters and semiconductors. In addition, placing an adhesive resin on the lowest layer improves electrode strength and can thus reduce defects resulting from drop tests, for example.

Yet further, a circuit pattern can be formed in the top layer, that is, the low dielectric constant, low temperature co-fired ceramic layer with cavity 19.

It is also possible, as described in the second embodiment, to simultaneously reduce size and improve performance by bonding ceramic layers of different dielectric constants where each ceramic layer contains suitably optimized circuit elements. Furthermore, due to the relationship between the characteristic impedance of the strip lines, the dielectric constant of the top ceramic layer is preferably less than 10, and the dielectric constant of the bottom ceramic layer is preferably 10 or greater, and further preferably from approximately 40 to approximately 60.

As described above, a ceramic device according to this third embodiment of the invention is achieved by using an adhesive resin to bond a ceramic layer with another ceramic layer of a different dielectric constant. Furthermore, the ceramic device has two or more ceramic layers each having a different dielectric constant, the top-most layer being a low dielectric constant, low temperature co-fired ceramic layer with a cavity formed therein and a dielectric constant of less than 10, and the bottom layer being a high dielectric constant, low temperature co-fired ceramic layer with a dielectric constant of 10 or higher. In addition, an adhesive resin is disposed between the top and bottom low temperature co-fired ceramic layers, and on the bottom-most layer, that is, on the bottom of the bottom ceramic layer. As a result, this embodiment provides a multilayer ceramic RF device that simultaneously achieves a small size and high performance.

Figure 4:
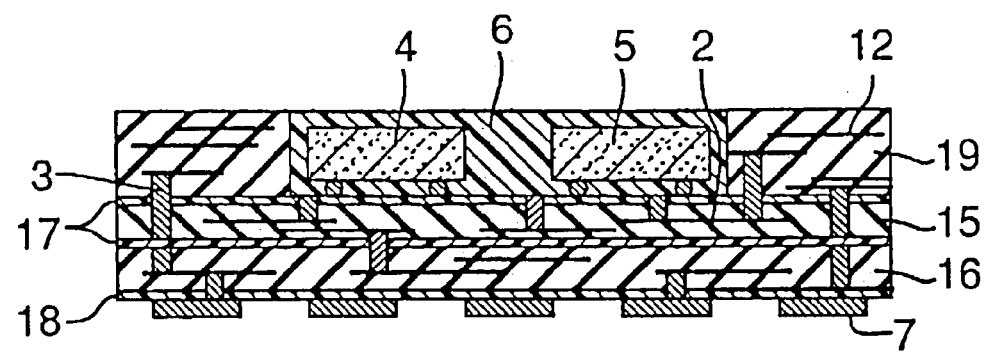
FIG. 4 is a section view of a multilayer ceramic RF device according to a fourth preferred embodiment of the present invention.

FIG. 4 is a section view of a multilayer ceramic RF device according to a fourth preferred embodiment of the present invention.

Shown in FIG. 4 are a low dielectric constant, low temperature co-fired ceramic layer with a cavity 19, a high dielectric constant, low temperature co-fired ceramic layer 15, low dielectric constant, low temperature co-fired ceramic layer 16, adhesive resins 17 and 18, multilayer circuit conductors 2, interlayer via holes 3, bare semiconductor chip 4, SAW filter 5, sealing resin 6, and LGA 7.

What differs between this ceramic device and the ceramic device shown in FIG. 3 is that instead of a low temperature co-fired ceramic layer with a cavity, a low dielectric constant, low temperature co-fired ceramic layer with a cavity 19 is disposed as the top layer with a low dielectric constant, low temperature co-fired ceramic layer 16 disposed as the bottom layer and a high dielectric constant, low temperature co-fired ceramic layer 15 disposed as a middle layer between ceramic layers 19 and 16. In addition, adhesive resin 17 is disposed at the bonding interface between the low temperature co-fired ceramic layers, and adhesive resin 18 is formed as the bottom-most layer on the bottom of ceramic layer 16.

The operation of a multilayer ceramic RF device thus comprised is described below with reference to FIG. 4.

The intralayer capacitors and inductors are formed inside the ceramic layer with cavity 19, in the high dielectric constant, low temperature co-fired ceramic layer 15, and in the low dielectric constant, low temperature co-fired ceramic layer 16 by using the multilayer circuit conductors 2. The multilayer circuit patterns formed in the monolithic multilayer, low temperature co-fired ceramic layers are made of copper or silver, and the circuit patterns are electrically connected by via holes formed at the desirable electrical connections.

The adhesive resins 17 and 18 are sheets of an uncured thermosetting resin compound containing inorganic filler. Holes are then formed as desired in the sheets and then filled with a conductive resin material. These adhesive resin sheets are then placed between the low temperature co-fired ceramic layers 19, 15, and 16 and set to form a monolithic device. A LGA 7 is formed on the bottom of the ceramic device for making external connections.

The bare semiconductor chip 4 and SAW filter 5 are mounted face down inside the cavity, which is then filled with sealing resin 6 so as to cover the contained components. These components combined form an RF circuit so that, for example, the ceramic device functions as a multilayer RF switch or other type of ceramic multilayer RF device.

The big difference between this embodiment and the third embodiment above is that a low dielectric constant, low temperature co-fired ceramic layer with a cavity 19 is disposed as the top layer, a high dielectric constant, low temperature co-fired ceramic layer 15 is disposed as a middle layer, and a low dielectric constant, low temperature co-fired ceramic layer 16 is disposed as the bottom layer with adhesive resin 17 disposed at the bonding interfaces between the low temperature co-fired ceramic layers. Finally, adhesive resin 18 is formed as the bottom-most layer on the bottom of ceramic layer 16.

By separately firing the low temperature co-fired ceramic layers 19, 15, and 16, and then bonding the separately fired ceramic layers together by using adhesive resin 17, the adhesive resin layer absorbs warping of the ceramic layers resulting from differences in thermal expansion coefficients during firing.

Providing a cavity in a multilayer monolithic ceramic device greatly increases the potential for warping due to asymmetry in the top and bottom layers. On the other hand, the structure of the present embodiment is an extremely effective way to improve the flatness of the ceramic device surface, which is essential to mounting bare chips including SAW filters and semiconductors. In addition, placing an adhesive resin on the lowest layer improves electrode strength and can thus reduce defects resulting from drop tests, for example.

Furthermore, disposing a high dielectric constant, low temperature co-fired ceramic layer between low dielectric constant, low temperature co-fired ceramic layers significantly improves the degree of freedom designing the ceramic device. For example, a high dielectric constant ceramic suitable for forming high capacitance capacitors and low loss resonators, and a low dielectric constant ceramic suitable for forming low loss inductances can be formed to an optimum thickness according to the circuit scale.

A ceramic device according to this fourth embodiment of the invention thus comprises a ceramic layer bonded by an adhesive resin to different ceramic layers having a different dielectric constant. More specifically, a ceramic device according to this embodiment of the invention is a multilayer ceramic device consisting of three or more ceramic layer of different dielectric constants. Yet further specifically, the topmost layer of this ceramic device is a low dielectric constant, low temperature co-fired ceramic layer with cavity 19 with a dielectric constant less than 10, the middle layer is a high dielectric constant low temperature co-fired ceramic layer with a dielectric constant of 10 or higher, the bottom layer is a low dielectric constant, low temperature co-fired ceramic layer with a dielectric constant of less than 10, and an adhesive resin is disposed between each of the ceramic layers and as the bottom-most layer on the bottom of the bottom ceramic layer. As a result, the present embodiment also provides a multilayer ceramic RF device that simultaneously reduces size and improves performance.

This fourth embodiment of the invention makes it possible to unify the wireless circuit parts of mobile telephones and other communications devices in various ways. For example, if the semiconductor chip is a plurality of PIN diodes and the SAW filter has an unbalanced input, balanced output design, an antenna switch for a dual band system offering digital mobile telephone (global system for mobile communication: GSM) and DCS service, or GSM and IMT 2000 service, or a triple band system further incorporating a personal communication system (PCS), can be integrated with the receiver SAW filter. This contributes to further reducing device size, and thus contributes to reducing communications device size.

It will be obvious to one with ordinary skill in the related art that the semiconductor chip shall not be limited to PIN diodes. For example, integration with GaAs FET switches, low noise amplifiers (LNA), mixers, and other front end ICs is also possible.

Figure 5:
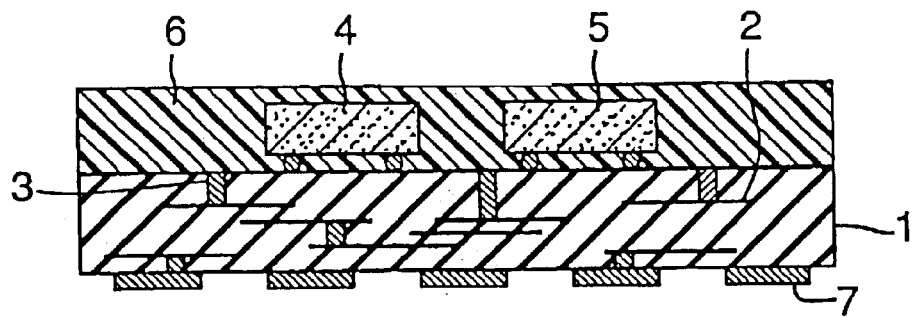
FIG. 5 is a section view of a multilayer ceramic RF device according to a fifth preferred embodiment of the present invention.

FIG. 5 is a section view of a multilayer ceramic RF device according to a fifth preferred embodiment of the present invention.

Figure 6:
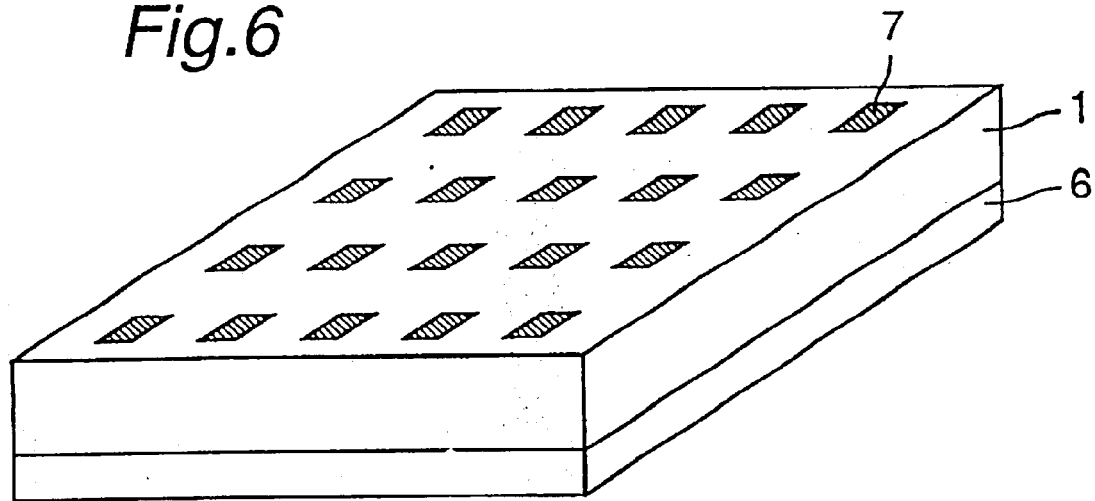
FIG. 6 is an oblique bottom view of a multilayer ceramic RF device according to a fifth preferred embodiment of the present invention.

Shown in FIG. 5 are a low temperature co-fired ceramic layer 1, multilayer circuit conductors 2, via holes 3, bare semiconductor chip 4, SAW filter 5, sealing resin 6, and LGA 7. FIG. 6 is an oblique view of the bottom of the multilayer ceramic RF device according to this fifth embodiment of the invention showing a typical arrangement of the LGA 7 shown in FIG. 5.

Figure 7:
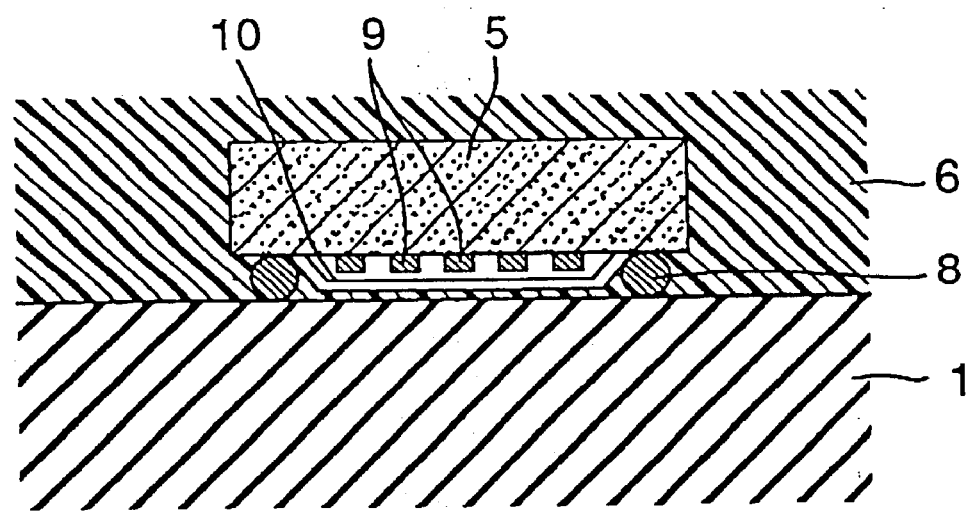
FIG. 7 is an enlarged section view of the SAW filter mounted face down on a multilayer ceramic RF device according to a fifth preferred embodiment of the present invention.

FIG. 7 is an enlarged section view of the SAW filter mounted on the multilayer ceramic RF device according to this fifth embodiment of the invention.

Operation of a multilayer ceramic RF device thus comprised is described next with reference to FIG. 5, FIG. 6, and FIG. 7.

High dielectric constant ceramics with a dielectric constant of 10 or higher include Bi—Ca—Nb—O (dielectric constant=58). The invention shall not be so limited, however, as other ceramics such as Ba—Ti—O and Zr(Mg, Zn, Nb)—Ti—Mn—O can also be used.

Low dielectric constant ceramics with a dielectric constant less than 10 include alumina borosilicate glass (dielectric constant=7), but the invention shall not be so limited as ceramics such as forsterite ceramics can also be used.

The intralayer capacitors and inductors are formed inside low temperature co-fired ceramic 1 by using the multilayer circuit conductors 2. The multilayer circuit patterns formed inside the multilayer monolithically fired, low temperature co-fired ceramic are copper or silver, and are electrically connected through via holes 3 at desirable places in the multilayer circuit pattern.

The pattern in each layer of the multilayer circuit pattern is formed by using a screen printing technique, for example. The via holes are formed in a dielectric sheet by using a puncher, for example, and the holes are then filed with a conductive paste by using a printing technique.

The RF devices such as bare semiconductor chips and SAW filters are mounted face down on the top of the ceramic device, and the top of the ceramic is then coated with a sealing resin so as to cover the bare chips mounted thereon.

As shown in FIG. 6, LGA 7 is formed on the bottom of the ceramic device for making external connections. The top of the ceramic device is coated with a sealing resin so as to encapsulate the bare semiconductor chip and SAW filter mounted face down on the top of the ceramic device. These components combined form an RF circuit so that, for example, the ceramic device functions as a multilayer RF switch or other type of ceramic multilayer RF device.

As shown in the enlarged view in FIG. 7, a plurality of SAW terminals 9 is formed on the bottom of the SAW filter 5, sealed by an airtight sealing resin 10. Externally formed bump electrodes 8 electrically connect the SAW filter 5 to the ceramic device.

This embodiment of the invention differs greatly from the prior art in that a bare SAW filter chip and bare semiconductor chip operating at a frequency above the ultra high frequency (UHF) band are mounted face down on top of a flat ceramic device, and are then coated with a sealing resin formed on top of the ceramic device so as to coat the bare chips. The bare semiconductor chips include bipolar transistors, field effect transistor (FET), diodes, and integrated circuits (ICs), and are made from silicon and other compound semiconductor materials. A SAW filter is a single crystal piezoelectric element of quartz, lithium tantalate ($LiTaO_3$) or lithium niobate ($LiNbO_3$), for example. These components can be mounted face down by using stud bump bonding (SBB), gold to gold interconnection (GGI), or other bump connection technique.

At frequencies above 300 MHz, that is, above the ultra high frequency (UHF) band, packaged semiconductors typically have a parasitic impedance component resulting from the leads and molding resins characteristic of the packaged structure, preventing the common benefits characteristic of semiconductor devices from being fully realized. More specifically, this parasitic impedance component contributes to a drop in gain, an increase in frequency deviation, and degraded noise characteristics. Numerous external components are also made necessary for impedance matching, obviously increasing the number of components and overall circuit scale.

On the other hand, the configuration of this embodiment of the present invention enables bare chip semiconductors to be used. This eliminates the leads and molding resin unique to a packaged configuration, and thus completely eliminates any parasitic impedance component effects.

Furthermore, mounting the bare chips by using a face down, bump connection technique results in an extremely small parasitic impedance component and outstanding frequency characteristic.

In other words, the configuration of the present invention improves gain, reduces frequency deviation, and achieves good noise characteristics. In addition, bare chip mounting means that package size can be ignored and a small device can be achieved because the mounting area can generally be made smaller. Yet further, substantially no external components are required.

As also described above, the top of the ceramic device according to this preferred embodiment is completely coated with a sealing resin to protect the bare semiconductor chips. A dielectric film of silicon oxide or silicon nitride, for example, generally protects the surface of the bare semiconductor chips, and further coating the chips with a sealing resin thus further improves reliability.

Coating the top of the ceramic device with a sealing resin also forms a smooth top surface on the multilayer ceramic RF device. The multilayer ceramic RF device can thus be automatically mounted robotically, and can therefore be easily handled as a surface mounted (SMD) RF device.

Using an LGA to form electrodes on the bottom of the ceramic device makes it easy to achieve a multiple pin device, and makes it simple to produce large-scale circuit compound devices containing such components as bare semiconductor chips and SAW filters.

Furthermore, face down mounting a SAW filter sealed airtight by a resin enables devices conventionally requiring a package with a cavity in order to assure airtightness to be mounted on a flat substrate. This means that bare chips can be easily mounted and integrated with the ceramic device as shown in FIG. 5.

As described above, this embodiment of the invention disposes a multilayer circuit pattern of copper or silver inside multilayer monolithically fired, low temperature co-fired ceramic layers with electrical connections between the circuit patterns completed through via holes formed at desirable locations. LGA terminals are also formed on the bottom of the multilayer ceramic device, while semiconductor bare chips and SAW filters operating at a frequency above the ultra high frequency (UHF) band are mounted face down on the top of the ceramic device and are then coated and sealed with a sealing resin covering the entire top of the ceramic device. This produces small devices with excellent frequency characteristics and yet further improved reliability. This configuration also makes it possible to provide a surface mounted device (SMD) that is easy to handle and can be automatically mounted.

Figure 8:
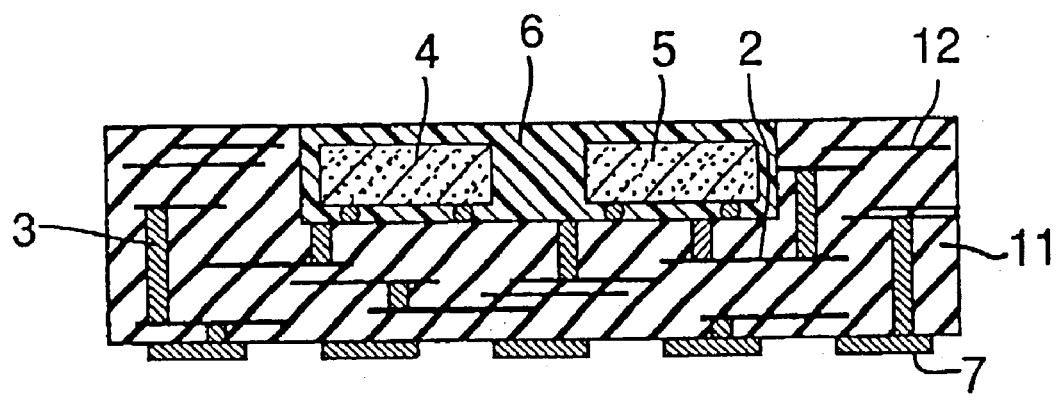
FIG. 8 is a section view of a multilayer ceramic RF device according to a sixth preferred embodiment of the present invention.

FIG. 8 is a section view of a multilayer ceramic RF device according to a sixth preferred embodiment of the present invention. Shown in FIG. 8 are a low temperature co-fired ceramic layer with cavity 11, multilayer circuit conductors 2, via holes 3, bare semiconductor chip 4, SAW filter 5, sealing resin 6, and LGA 7. This embodiment differs from that shown in FIG. 5 in that the low temperature co-fired ceramic 1 is replaced with a low temperature co-fired ceramic layer 11 having therein a cavity.

Operation of the multilayer ceramic RF device shown in FIG. 8 is described next below.

The intralayer capacitors and inductors are formed inside the low temperature co-fired ceramic layer with cavity 11 by using the multilayer circuit conductors 2. The multilayer circuit patterns formed inside the multilayer, low temperature monolithically fired ceramic layer with cavity are made from copper or silver, and electrically connected through interlayer via holes at desirable places in the multilayer circuit patterns.

The pattern in each layer of the multilayer circuit pattern is formed by using a screen printing technique, for example. The interlayer via holes are formed in a dielectric sheet by using a puncher, for example, and the holes are then filled with a conductive paste by using a printing technique. The cavity is also formed by opening a hole in a dielectric sheet with a puncher. The bare semiconductor chip 4 and SAW filter 5 are mounted face down in the cavity, which is then filled with sealing resin 6 to cover the bare semiconductor chip 4 and SAW filter 5.

A LGA 7 is formed on the bottom of the ceramic device for making external connections. These components combined form an RF circuit so that, for example, the ceramic device functions as a multilayer RF switch or other type of ceramic multilayer RF device.

This embodiment differs particularly from the embodiment shown in FIG. 5 in that the low temperature co-fired ceramic layer 1 is replaced by low temperature co-fired ceramic layer with cavity 11. Mounting the bare chip components inside a cavity prevents the sealing resin 6 from flowing to the sides, and thus reduces shape changes resulting from resin drips. Defect determinations resulting from recognition errors during component mounting can therefore be reduced.

Forming a cavity in the ceramic layer also makes it possible to form a circuit pattern 12 in the ceramic surrounding the area in which the semiconductor elements are mounted. Internal circuitry can thus be formed efficiently within a confined area, improving device characteristics and reducing device size.

As described above, this sixth embodiment of the invention features a cavity forming a recess in the top of the ceramic layer. The sealing resin then fills this cavity. The cavity effectively prevents the sealing resin from flowing down the sides, and thus prevents shape deformation resulting from resin drips. It is therefore possible to provide a multilayer ceramic RF device that prevents defect determinations resulting from shape recognition during mounting.

Figure 9:
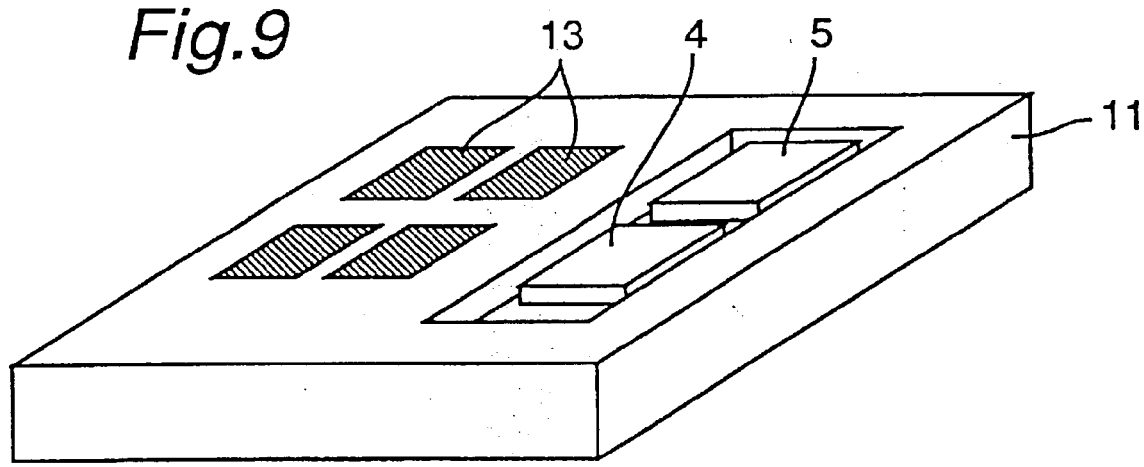
FIG. 9 is an oblique view of a multilayer ceramic RF device according to a sixth preferred embodiment of the present invention.

As shown in FIG. 9, the cavity can be formed to one side in the top of the ceramic layer and an array antenna 13 can be formed on the remaining flat surface area to the other side of the top. This configuration provides improved functionality as a wireless circuit device.

Figure 10:
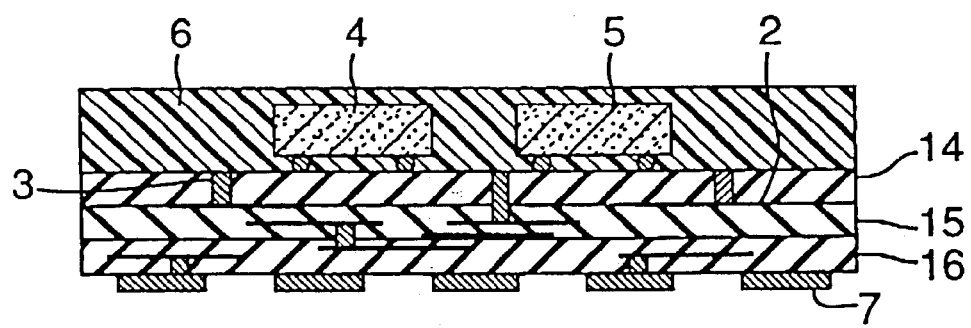
FIG. 10 is a section view of a multilayer ceramic RF device according to a seventh preferred embodiment of the present invention.

FIG. 10 is a section view of a multilayer ceramic RF device according to a sixth preferred embodiment of the present invention. Shown in FIG. 10 are low dielectric constant, low temperature co-fired ceramic layers 14 and 16, high dielectric constant, low temperature co-fired ceramic layer 15, multilayer circuit conductors 2, via holes 3, bare semiconductor chip 4, SAW filter 5, sealing resin 6, and LGA 7. This embodiment differs from that shown in FIG. 5 in that the single low temperature co-fired ceramic 1 is replaced with a three layer laminate consisting of a low dielectric constant, low temperature co-fired ceramic layer 14 as the top layer, high dielectric constant, low temperature co-fired ceramic layer 15 as the middle layer, and a low dielectric constant, low temperature co-fired ceramic layer 16 as the bottom layer.

Operation of the multilayer ceramic RF device shown in FIG. 10 is described next below.

The intralayer capacitors and inductors are formed inside the low dielectric constant, low temperature co-fired ceramic layers 14 and 16, and high dielectric constant, low temperature co-fired ceramic layer 15 by using the multilayer circuit conductors 2. The multilayer circuit patterns formed inside the multilayer, low temperature monolithically fired ceramic layers of different types are made from copper or silver, and electrically connected through interlayer via holes at desirable places in the multilayer circuit patterns. Bare semiconductor chip 4 and SAW filter 5 are mounted face down on top of the ceramic device, which is then coated with a sealing resin 6 so as to cover the bare semiconductor chip 4 and SAW filter 5.

LGA 7 is formed on the bottom of the ceramic device for making external connections. These components combined form an RF circuit so that, for example, the ceramic device functions as a multilayer RF switch or other type of ceramic multilayer RF device.

In general, wavelength can be shortened with strip lines that can be formed in high dielectric constant ceramics so that, for example, the length of a strip line resonator can be shortened inversely proportional to the square root of the dielectric constant. It follows that a high dielectric constant ceramic is a suitable material for making small, high Q strip line resonators. However, the characteristic impedance of a strip line is usually low. The characteristic impedance of a strip line formed by a screen printing process with a minimum line width of 100 mm and 2 mm shield gap, for example, is about 20 ohms to 30 ohms. It is therefore in practice not possible to form a 50 ohm line. On the other hand, the high dielectric constant means it is simple to create high capacitance intralayer capacitors in a limited area.

On the other hand, while the wavelength of strip lines formed in a low dielectric constant ceramic cannot be shortened as much, it is relatively easy to achieve a high characteristic impedance of 50 ohms or more, and intralayer inductors can thus be easily produced. Furthermore, because the dielectric constant is low, the field coupling capacity of adjacent strip lines is relatively low and thus suited to forming circuit layers.

It is therefore possible to simultaneously reduce size and improve performance by bonding ceramic layers of different dielectric constants where each ceramic layer contains suitably optimized circuit elements. Furthermore, due to the relationship between the characteristic impedance of the strip lines, the dielectric constant of the top high dielectric constant ceramic layer is preferably less than 10, the dielectric constant of the middle layer is preferably 10 or greater, and further preferably from approximately 40 to approximately 60, and the dielectric constant of the bottom layer is preferably less than 10.

The configuration of this ceramic device is also substantially symmetrical from top to bottom as a result of sandwiching the high dielectric constant, low temperature co-fired ceramic layer 15 between a top low dielectric constant, low temperature co-fired ceramic layer 14 and bottom low dielectric constant, low temperature co-fired ceramic layer 16. As a result, warping of the ceramic device as a result of differences in the thermal expansion coefficients during firing can be prevented.

Also, preferably, the high dielectric constant, low temperature co-fired ceramic layer 15 is thicker than the top low dielectric constant, low temperature co-fired ceramic layer 14 and the bottom low dielectric constant, low temperature co-fired ceramic layer 16. Therefore, the high Q strip line may be formed inside the high dielectric constant, low temperature co-fired ceramic layer 15, and may have the circuit with low loss.

It should also be noted that low dielectric constant ceramics of low temperature co-fired ceramics are generally stronger than high dielectric constant ceramics of low temperature co-fired ceramics. It is therefore possible to produce a device with high terminal strength by, for example, forming LGA electrodes on the bottom of a low dielectric constant, low temperature co-fired ceramic as described in this embodiment.

As described above, a ceramic device according to this preferred embodiment features multiple layers of different types of ceramic having different dielectric constants. More specifically, the ceramic laminate has three or more ceramic layers with different dielectric constants with the dielectric constant of the top low dielectric constant, low temperature co-fired ceramic layer is less than 10, the dielectric constant of the middle high dielectric constant, low temperature co-fired ceramic layer is ten or more, and the dielectric constant of the bottom ceramic layer is less than 10. It is therefore possible to provide a multilayer ceramic RF device that simultaneously reduces size and improves performance.

Figure 11:
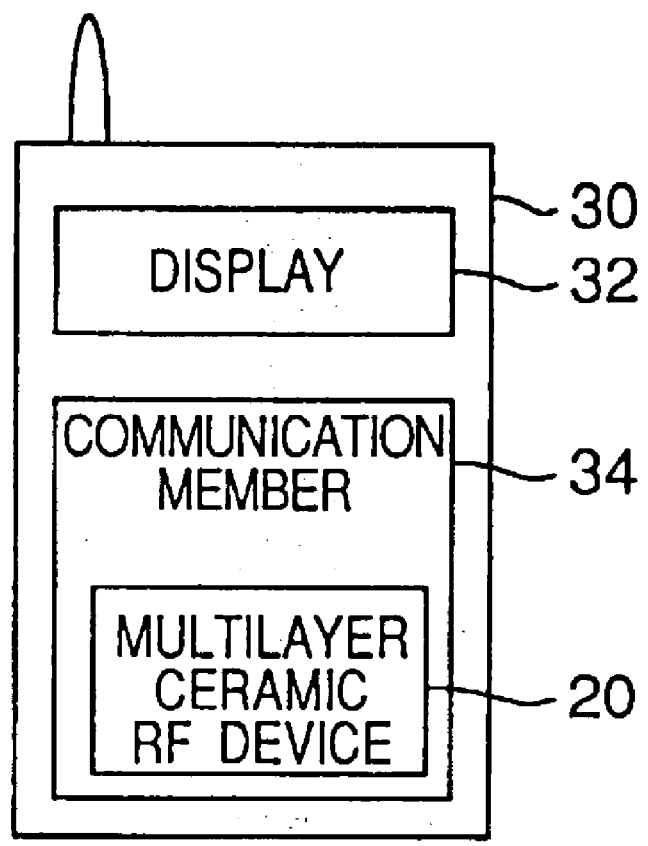
FIG. 11 is a block diagram of a mobile telephone according to a eighth preferred embodiment of the present invention.
Figure 12:
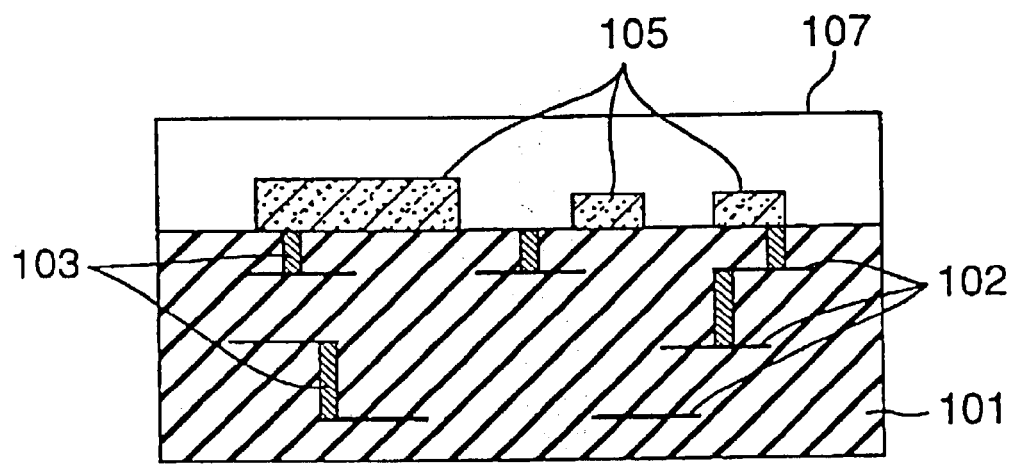
FIG. 12 is a section view of a multilayer ceramic RF device according to the related art.
Figure 13A:
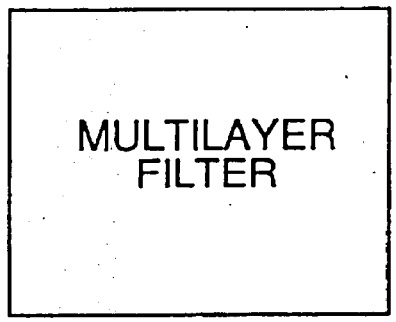
FIG. 13A is a block diagram showing the configuration of a multilayer filter device according to the related art.
Figure 13B:
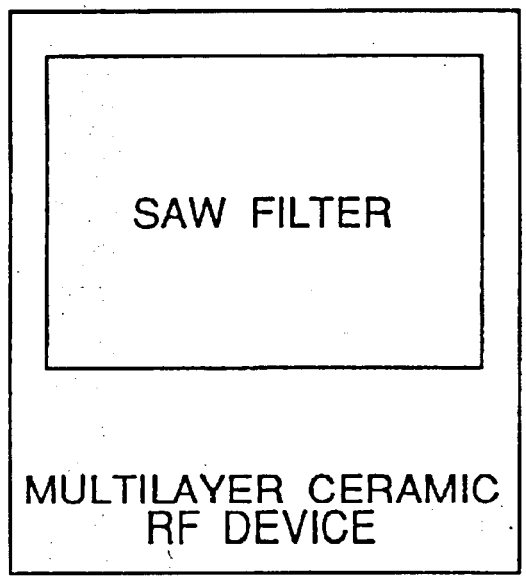
FIG. 13B is a block diagram showing a SAW filter.
Figure 13C:
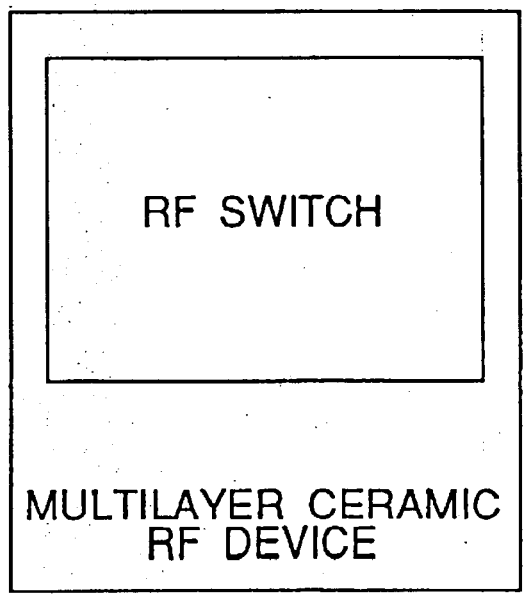
FIG. 13C is a block diagram showing an RF switch.

A mobile telephone 30 as mobile terminal device according to a eighth preferred embodiment of the invention has a display 32 and a communication member 34. The communication member 34 has a multilayer ceramic device 20 according to the first preferred embodiment, as shown in the block diagram in FIG. 11. The multilayer ceramic device 20 includes, as shown in the section view in FIG. 1, a high dielectric constant ceramic layer 15 with a dielectric constant of 58 at the top, a low dielectric constant ceramic layer 14 with a dielectric constant of 7 at the bottom, and a thermosetting adhesive resin 17 with a dielectric constant of approximately 4 between the top and bottom ceramic layers. Both of the ceramic layers 14 and 15 contain inside thereof copper or silver multilayer circuit conductors 2 to which electrical connections are made by way of via holes. A plurality of through holes is also provided in the adhesive resin 17 sandwiched between the two ceramic layers 14 and 15. The through holes are filled with a conductive resin for electrically connecting the multilayer circuit patterns of the top and bottom ceramic layers. This reduces the parasitic capacitance occurring between the two ceramic layers when compared with direct contact between two ceramic layers having different dielectric constants. A land grid array (LGA) 7 is disposed on the bottom of the bottom low dielectric constant ceramic layer 14. Another thermosetting adhesive resin 18 is sandwiched between the bottom of the ceramic layer 14 and the LGA 7, thereby increasing device strength.

It is therefore possible to simultaneously may reduce device size and improve performance mobile telephone 30, because the multilayer ceramic device 20 may reduce device size and improve performance. It is noted that the multilayer ceramic device 20 according to the first embodiment is used in the mobile telephone 30. The invention shall not be so limited, however, as other multilayer ceramic device according to any other embodiment can be used.

Benefits of this Invention

As described above, a thermosetting adhesive resin sheet is disposed between each of the ceramic layers. This reduces the parasitic capacitance that occurs between two ceramic layers of different dielectric constants when compared with a configuration in which there is direct contact between the ceramic layers.

Furthermore, a land grid array is formed on the bottom of the bottom ceramic layer with another thermosetting adhesive resin sheet sandwiched between the ceramic layer and the land grid array. This increases device strength.

The present invention also enables bare semiconductor chips and SAW filter components to be incorporated in the multilayer ceramic RF device. This improves device functionality, reduces overall device size and profile (height), makes manufacturing easier, and improves reliability. Yet further, the present invention can provide multilayer ceramic RF devices providing improved overall performance when plural functions are combined through optimized circuit design.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A multilayer ceramic device comprising:
a first ceramic layer having a multilayer circuit pattern electrically connected through interlayer via holes;
a second ceramic layer having a multilayer circuit pattern electrically connected through interlayer via holes, said second ceramic layer being layered on said first ceramic layer; and
at least one bare semiconductor chip on a surface of said first ceramic layer that does not face said second ceramic layer,
wherein said bare semiconductor chip includes an electrode part that faces said surface of said first ceramic layer and a top part which are coated with a sealing resin,
said second ceramic layer has a land grid array terminal disposed on a surface of said second ceramic layer that does not face said first ceramic layer, and
said first ceramic layer and said second ceramic layer have different dielectric constants.

2. A mobile terminal device comprising:
a display; and
a communication member having a multilayer ceramic device comprising:
  a first ceramic layer having a multilayer circuit pattern electrically connected through interlayer via holes; and
  a second ceramic layer having a multilayer circuit pattern electrically connected through interlayer via holes, said second ceramic layer being layered on said first ceramic layer; and
  at least one bare semiconductor chip having an electrode part and a top part, said bare semiconductor chip being mounted on a surface of said first ceramic layer that does not face said second ceramic layer,
  wherein said electrode part of said bare semiconductor chip faces said surface of said first ceramic layer, and said electrode part and said top part of said at least one bare semiconductor chip are coated with a sealing resin,
  said second ceramic layer has a land grid array terminal disposed on a surface of said second ceramic layer that does not face said first ceramic layer, and
  said first ceramic layer and said second ceramic layer have different dielectric constants.

3. A multilayer ceramic device comprising:
a first ceramic layer having a recess and a multilayer circuit pattern electrically connected through interlayer via holes;
a second ceramic layer having a multilayer circuit pattern electrically connected through interlayer via holes, said second ceramic layer being layered on said first ceramic layer;
at least one bare semiconductor chip mounted on a bottom of the recess defined by said first ceramic layer, wherein said bare semiconductor chip includes an electrode part that faces the bottom of the recess, and a top part of said bare semiconductor chip is coated with a sealing resin; and
a land grid array terminal disposed on a surface of said second ceramic layer that does not face said first ceramic layer.

4. A multilayer ceramic device comprising:
a first ceramic layer having a multilayer circuit pattern electrically connected through interlayer via holes;
a second ceramic layer having a multilayer circuit pattern electrically connected through interlayer via holes, said second ceramic layer being layered on said first ceramic layer;
at least one bare semiconductor chip on a surface of said first ceramic layer that does not face said second ceramic layer; and
a third ceramic layer having a multilayer circuit pattern electrically connected through interlayer via holes, said third ceramic layer being laminated on a surface of said second ceramic layer that does not face said first ceramic layer,
wherein said bare semiconductor chip includes an electrode part that faces said surface of said first ceramic layer and a top Dart which are coated with a sealing resin,
said third ceramic layer has a land grid array terminal disposed on a surface of said third ceramic layer that does not face said first ceramic layer, and
said first ceramic layer has a dielectric constant of less than 10, said second ceramic layer has a dielectric constant of 10 or higher, and said third ceramic layer has a dielectric constant of less than 10.

5. A multilayer ceramic device comprising:
a first ceramic layer having a multilayer circuit pattern electrically connected through interlayer via holes,
a second ceramic layer having a multilayer circuit pattern electrically connected through interlayer via holes, said second ceramic layer being layered on said first ceramic layer;
at least one bare semiconductor chip on a surface of said first ceramic layer that does not face said second ceramic layer; and
a third ceramic layer having a multilayer circuit pattern electrically connected through interlayer via holes,
wherein said bare semiconductor chip includes an electrode part that faces said surface of said first ceramic layer and a top part which are coated with a sealing resin,
said third ceramic layer has a land grid array terminal disposed on a surface of said third ceramic layer that does not face said first ceramic layer, and
said second ceramic layer is thicker than said first ceramic layer and said third ceramic layer.

6. A multilayer ceramic device comprising:
a first ceramic layer having a recess at a top part thereof and a first multilayer circuit pattern electrically connected through interlayer via holes;
a second ceramic layer having a second multilayer circuit pattern electrically connected through interlayer via holes, said second ceramic layer being layered on said first ceramic layer; and at least one bare semiconductor chip mounted on a bottom of the recess, wherein said at least one bare semiconductor chip includes an electrode part that faces the recess bottom, and a top of said at least one bare semiconductor chip is coated with a sealing resin.

7. A multilayer ceramic device comprising:
a first ceramic layer having a recess at a top part thereof and a first multilayer circuit pattern electrically connected through interlayer via holes;
a second ceramic layer having a second multilayer circuit pattern electrically connected through interlayer via holes, said second ceramic layer being layered on said first ceramic layer;

at least one bare semiconductor chip mounted on a bottom of the recess, wherein said at least one bare semiconductor chip includes an electrode part that faces the recess bottom, and a top of said at least one bare semiconductor chip is coated with a sealing resin; and an array antenna formed by an electrode pattern disposed on a flat part on a surface of said first ceramic layer that does not face said second ceramic layer.

* * * * *

UNITED STATES PATENT AND TRADEMARK OFFICE
CERTIFICATE OF CORRECTION

PATENT NO. : 6,784,765 B2
DATED : August 31, 2004
INVENTOR(S) : Toru Yamada et al.

Page 1 of 1

It is certified that error appears in the above-identified patent and that said Letters Patent is hereby corrected as shown below:

Column 20,
Line 15, replace "Dart" with -- part --.

Signed and Sealed this

Second Day of August, 2005

JON W. DUDAS
*Director of the United States Patent and Trademark Office*